US012742254B2

(12) United States Patent
Ishihara et al.

(10) Patent No.: US 12,742,254 B2
(45) Date of Patent: Sep. 22, 2026

(54) METHOD FOR EVALUATING QUARTZ GLASS CRUCIBLE, METHOD FOR MANUFACTURING THE SAME, AND QUARTZ GLASS CRUCIBLE

(71) Applicant: SHIN-ETSU QUARTZ PRODUCTS CO., LTD., Tokyo (JP)

(72) Inventors: Yu Ishihara, Echizen (JP); Yuji Baba, Takefu (JP); Tetsuji Ueda, Echizen (JP); Yuya Yokosawa, Koriyama (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 235 days.

(21) Appl. No.: 18/279,767

(22) PCT Filed: Feb. 25, 2022

(86) PCT No.: PCT/JP2022/007855
§ 371 (c)(1),
(2) Date: Aug. 31, 2023

(87) PCT Pub. No.: WO2022/186067
PCT Pub. Date: Sep. 9, 2022

(65) Prior Publication Data

US 2024/0141546 A1 May 2, 2024

(30) Foreign Application Priority Data

Mar. 5, 2021 (JP) ................................ 2021-035428
Jul. 21, 2021 (JP) ................................ 2021-120775

(51) Int. Cl.
*C30B 15/10* (2006.01)

(52) U.S. Cl.
CPC .................................. *C30B 15/10* (2013.01)

(58) Field of Classification Search
CPC ....... C30B 15/10; C30B 55/002; C30B 29/06; C03B 19/095; G01N 21/646; G01N 21/8806
See application file for complete search history.

(56) References Cited

U.S. PATENT DOCUMENTS

2003/0074920 A1 4/2003 Ohama et al.
2004/0025783 A1 2/2004 Ohama et al.
(Continued)

FOREIGN PATENT DOCUMENTS

JP H05-208838 A 8/1993
JP 2000103694 A * 4/2000 ........... C03B 19/095
(Continued)

OTHER PUBLICATIONS

Dec. 13, 2024 Search Report issued in European Patent Application No. 22763123.1.

(Continued)

*Primary Examiner* — Robert M Kunemund
(74) *Attorney, Agent, or Firm* — Oliff PLC

(57) ABSTRACT

A method for evaluating a quartz glass crucible constituted by an outer layer formed of an opaque quartz glass containing a bubble, and an inner layer formed of a transparent quartz glass. The method includes steps of preparing a quartz glass crucible to be evaluated, irradiating the quartz glass crucible to be evaluated with ultraviolet rays as an excitation light, detecting a blue fluorescence emitted from the quartz glass crucible irradiated with the ultraviolet rays, and evaluating a state of oxygen deficiency defects in the outer layer of the quartz glass crucible on the basis of existence or non-existence of the blue fluorescence. The method allows hydrogen doping and water vapor introduc- (Continued)

S1 PREPARE QUARTZ GLASS CRUCIBLE TO BE EVALUATED

S2 IRRADIATE QUARTZ GLASS CRUCIBLE TO BE EVALUATED WITH ULTRAVIOLET RAYS AS EXCITATION LIGHT

S3 DETECT BLUE FLUORESCENCE EMITTED FROM QUARTZ GLASS CRUCIBLE IRRADIATED WITH ULTRAVIOLET RAYS

S4 EVALUATE OXYGEN DEFICIENCY DEFECT STATE IN OUTER LAYER OF QUARTZ GLASS CRUCIBLE BASED ON EXISTENCE OR NON-EXISTENCE OF BLUE FLUORESCENCE tion to attain nondestructive and easy evaluation on the state of the oxygen deficiency defects generated in the quartz glass crucible.

16 Claims, 4 Drawing Sheets

(56) References Cited

U.S. PATENT DOCUMENTS

| | | | |
|---|---|---|---|
| 2007/0051296 | A1 | 3/2007 | Kemmochi et al. |
| 2010/0000465 | A1 | 1/2010 | Kishi et al. |
| 2011/0192758 | A1 | 8/2011 | Yamagata et al. |
| 2012/0137963 | A1 | 6/2012 | Sudo et al. |
| 2012/0260852 | A1 | 10/2012 | Sudo et al. |

FOREIGN PATENT DOCUMENTS

| | | | | | |
|---|---|---|---|---|---|
| JP | 2001-348240 | A | | 12/2001 | |
| JP | 2003-335513 | A | | 11/2003 | |
| JP | 2006008452 | A | * | 1/2006 | ............ C03B 19/01 |
| JP | 2006-089301 | A | | 4/2006 | |
| JP | 2007-326780 | A | | 12/2007 | |
| JP | 2008-094639 | A | | 4/2008 | |
| JP | 2011-020886 | A | | 2/2011 | |
| JP | 2012-116713 | A | | 6/2012 | |
| JP | 2013-014518 | A | | 1/2013 | |
| JP | 2013-139355 | A | | 7/2013 | |
| JP | 2014-065622 | A | | 4/2014 | |
| JP | 2017-031007 | A | | 2/2017 | |
| JP | 2018-035029 | A | | 3/2018 | |
| TW | 278437 | B | | 4/2007 | |
| WO | WO-2005102950 | A2 | * | 11/2005 | ............ C03B 32/00 |
| WO | 2011071176 | A1 | | 6/2011 | |

OTHER PUBLICATIONS

Mar. 18, 2025 Office Action issued in Japanese Patent Application No. 2021-035428.

Apr. 5, 2022 International Search Report issued in International Patent Application No. PCT/JP2022/007855.

Aug. 29, 2023 International Preliminary Report on Patentability issued in International Patent Application No. PCT/JP2022/007855.

May 20, 2025 Office Action issued in Japanese Patent Application No. 2021-120775.

Dec. 10, 2025 Office Action and Search Report issued in Taiwanese Patent Application No. 111126823.

Oct. 28, 2025 Decision of Refusal issued in Japanese Patent Application No. 2021-120775.

Apr. 2, 2026 Office Action issued in Singaporean Patent Application No. 11202306471T.

* cited by examiner

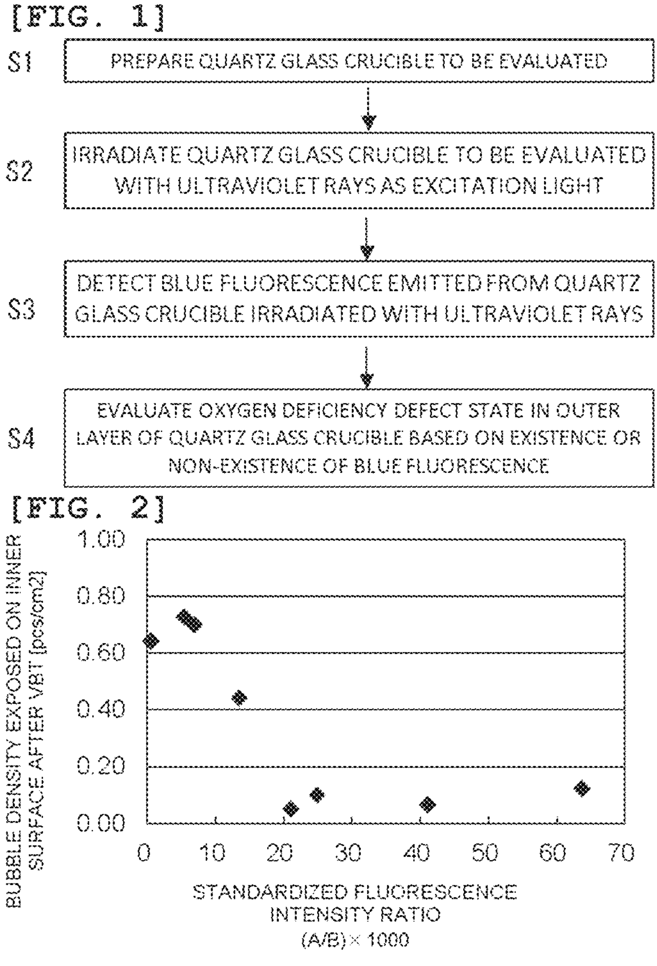
[FIG. 1]
S1
PREPARE QUARTZ GLASS CRUCIBLE TO BE EVALUATED
S2
IRRADIATE QUARTZ GLASS CRUCIBLE TO BE EVALUATED WITH ULTRAVIOLET RAYS AS EXCITATION LIGHT
S3
DETECT BLUE FLUORESCENCE EMITTED FROM QUARTZ GLASS CRUCIBLE IRRADIATED WITH ULTRAVIOLET RAYS
S4
EVALUATE OXYGEN DEFICIENCY DEFECT STATE IN OUTER LAYER OF QUARTZ GLASS CRUCIBLE BASED ON EXISTENCE OR NON-EXISTENCE OF BLUE FLUORESCENCE
[FIG. 2]
BUBBLE DENSITY EXPOSED ON INNER SURFACE AFTER VBT [pcs/cm2]
1.00
0.80
0.60
0.40
0.20
0.00
0
10
20
30
40
50
60
70
STANDARDIZED FLUORESCENCE INTENSITY RATIO
(A/B)×1000

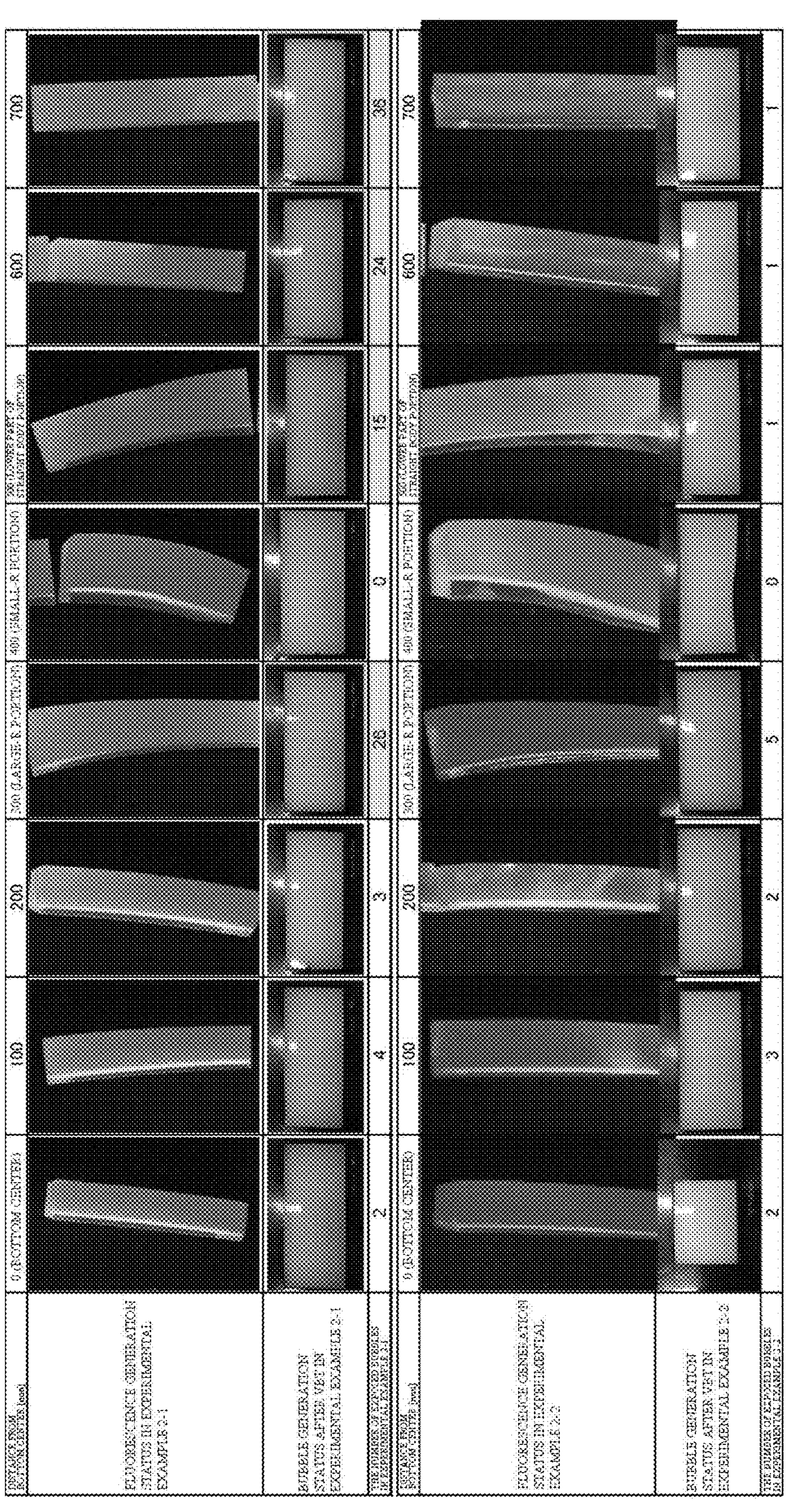
[FIG. 3]

[FIG. 4]
(a)
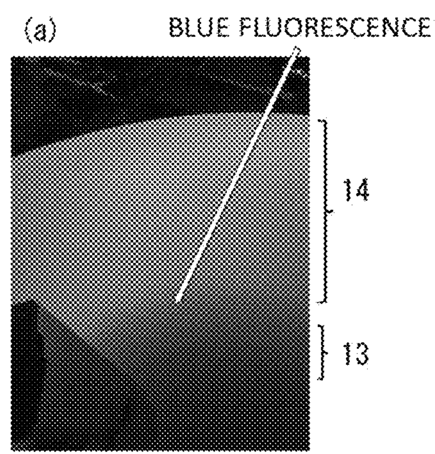
(b)
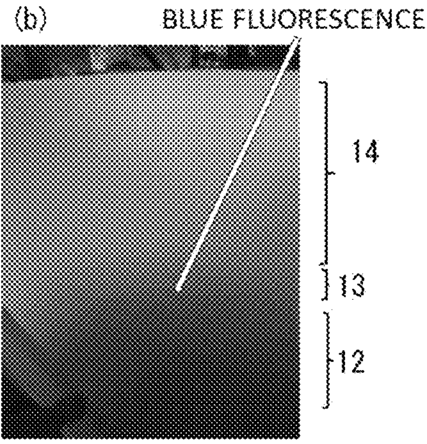
(c)
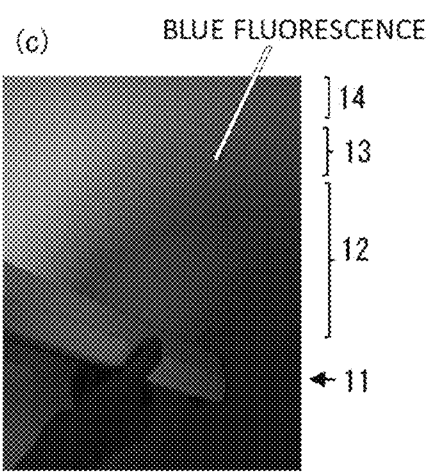

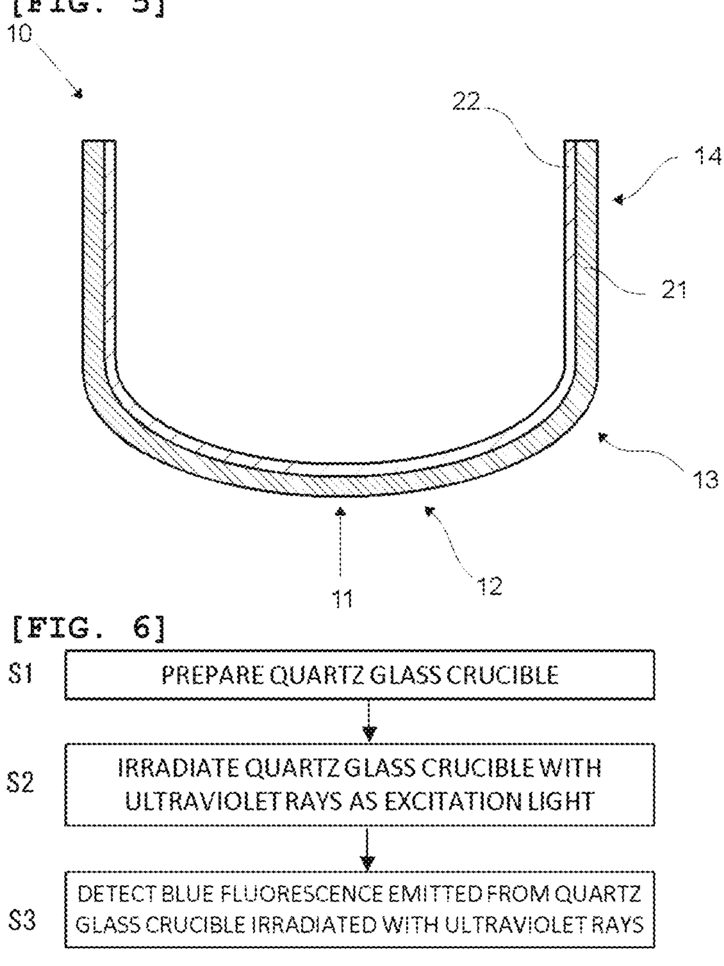
[FIG. 5]
10
22
14
21
13
11
12
[FIG. 6]
S1
PREPARE QUARTZ GLASS CRUCIBLE
S2
IRRADIATE QUARTZ GLASS CRUCIBLE WITH ULTRAVIOLET RAYS AS EXCITATION LIGHT
S3
DETECT BLUE FLUORESCENCE EMITTED FROM QUARTZ GLASS CRUCIBLE IRRADIATED WITH ULTRAVIOLET RAYS

METHOD FOR EVALUATING QUARTZ GLASS CRUCIBLE, METHOD FOR MANUFACTURING THE SAME, AND QUARTZ GLASS CRUCIBLE

TECHNICAL FIELD

The present invention relates to a method for evaluating a quartz glass crucible, a method for manufacturing the same, and a quartz glass crucible.

BACKGROUND ART

A so called Czochralski method ("CZ method") for manufacturing a silicon single crystal (silicon single crystal ingot) has been widespread. In the CZ method, the silicon melt is stored in a quartz glass crucible to bring a seed crystal into contact with the silicon melt surface. The quartz glass crucible is then rotated, and the seed crystal is pulled upward while being rotated in the opposite direction to raise the silicon single crystal ingot at a lower end of the seed crystal.

Generally, the quartz glass crucible is manufactured by the method called arc rotating melting method to be described below. First, a silicon dioxide powder (silica powder, quartz powder) as a raw material powder is supplied into a rotating mold, and molded under the centrifugal force into a crucible-like molded product. The molded product has its inner side heated and melted by an arc ignited flame to form a translucent quartz glass crucible base (outer layer) (base-forming step). During or after formation of the crucible base, the silicon dioxide powder is newly supplied into a heating atmosphere in the crucible base to form a transparent quartz glass inner layer on an inner surface side of the crucible base (inner-layer-forming step). The method for forming the inner layer formed of the transparent quartz glass by heating while scattering the quartz powder is called a scattering method.

In most cases, the outer layer of the quartz glass crucible is formed of a natural silicon dioxide powder, and the inner layer is formed of a synthetic silicon dioxide powder.

When pulling up the silicon single crystal from the silicon melt contained in the quartz glass crucible, a bubble contained in the inner layer of the quartz glass crucible may expand under decompression and high temperature conditions, and be discharged into the silicon melt. The bubble and a peeled piece caused upon discharge are taken into the silicon single crystal to cause a problem of deteriorating crystallinity of the silicon single crystal. Doping of the inner layer of the quartz glass crucible with hydrogen in manufacturing of the quartz glass crucible is known as the measure for coping with the problem. The hydrogen doping is effective for suppressing generation of the bubble. For example, Patent Document 1 discloses the method for manufacturing a silica glass crucible by supplying a quartz raw material powder into the mold to form a silica powder molded body with a crucible-like shape, and heating and melting the silica powder molded body by an arc discharge. In the method, when heating and melting by the arc discharge, the hydrogen gas is supplied to the inner surface of the silica powder molded body. Patent Document 2 discloses that the quartz glass crucible manufactured by the arc rotating melting method is held in a heated condition in a hydrogen or a hydrogen containing atmosphere.

As the method for doping the quartz glass crucible with hydrogen, doping of the raw material powder with hydrogen is known (Patent Documents 3, 4). The hydrogen doped silica powder (mostly, the synthetic quartz powder) is used for forming a transparent silica glass layer as the inner layer of the quartz glass crucible by the scattering method as described above.

Introduction of water vapor to the quartz glass crucible is a known process in the method for manufacturing the quartz glass crucible (Patent Document 5). Patent Document 5 discloses that introduction of the water vapor may suppress expansion of the bubble around the inner surface of the quartz glass crucible.

CITATION LIST

Patent Document

Patent Document 1: JP 2014-65622 A
Patent Document 2: JP H05-208838 A
Patent Document 3: JP 2003-335513 A
Patent Document 4: JP 2017-031007 A
Patent Document 5: JP 2001-348240 A
Patent Document 6: JP 2018-35029 A
Patent Document 7: JP 2006-89301 A
Patent Document 8: JP 2013-014518 A

SUMMARY OF INVENTION

Technical Problem

As described above, the hydrogen doped silica powder as disclosed in Patent Documents 3 and 4 is used for forming the transparent silica glass layer by the scattering method. However, in the case of the transparent silica glass layer formed by the scattering method, there may be the case that an intentional part of the inner layer is not sufficiently doped with hydrogen. In particular, the state of hydrogen doping may vary depending on the position. If the hydrogen doping is not sufficient, the effect of suppressing bubble expansion may not be sufficiently obtained. In order to locate such position, it is necessary to perform a heat treatment evaluation by executing a cut-out process. For example, after cutting a sample from the quartz glass crucible, VBT (Vacuum Bakeout Test) is conducted to expand the bubble to be made apparent. The evaluation is then performed based on the generation status. In this case, the sample has to be held for two hours and ten minutes at 1650° C. at the vacuum degree of $2\times10^{-2}$ Pa or lower. This inspection is a destructive inspection, and there is a problem that it takes time.

As described above, the typical quartz glass crucible is constituted by the outer layer formed of an opaque quartz glass containing a bubble, and the inner layer formed of a transparent quartz glass. However, the transparency degree of the inner layer (transparent layer) formed of the transparent quartz glass is not perfect because of existence of a substantial volume of bubbles. The exemplified references as above have been published for suppressing bubbles. Especially, with the "scattering method" implemented in the melting process for manufacturing the quartz glass crucible, the use of the hydrogen doped silica powder as disclosed in Patent Documents 3 and 4 forms a transparent layer with few bubbles (synthetic transparent layer formed of synthetic quartz glass raw material powder). However, in the transparent quartz glass layer (inner layer) formed by the scattering method, occasionally, the intentional part is not sufficiently doped with hydrogen (that is, the hydrogen doped state varies depending on the position).

The present invention has been made to solve the problem as above. It is a first object to provide a method for evaluating a quartz glass crucible, which allows nondestructive and easy evaluation of a state of oxygen deficiency defect in the outer layer of the quartz glass crucible by doping hydrogen and introducing a water vapor.

The present invention has been made to solve the problem as above. It is a second object to provide a quartz glass crucible having bubbles generated in the surface part of the inner layer satisfactorily suppressed over an entire surface.

Solution to Problem

The present invention has been made to solve the problem as above by providing the method for evaluating a quartz glass crucible which includes an outer layer formed of an opaque quartz glass containing a bubble, and an inner layer formed of a transparent quartz glass. The method includes a step of preparing a quartz glass crucible to be evaluated, a step of irradiating the quartz glass crucible to be evaluated with ultraviolet rays as an excitation light, a step of detecting a blue fluorescence emitted from the quartz glass crucible irradiated with the ultraviolet rays, and a step of evaluating a state of oxygen deficiency defects in the outer layer of the quartz glass crucible on the basis of existence or non-existence of the blue fluorescence.

The method for evaluating the quartz glass crucible allows nondestructive and easy evaluation of the state of the oxygen deficiency defect in the outer layer formed of the opaque quartz glass of the quartz glass crucible based on existence or non-existence of the blue fluorescence. The oxygen deficiency defect in the outer layer reflects the state of the inner layer doped with hydrogen or introduced with water vapor. The inventive method for evaluating the quartz glass crucible allows nondestructive and easy evaluation on the state of hydrogen doping and water vapor introduction in the inner layer.

In this case, it is possible to evaluate a distribution of the oxygen deficiency defects in the outer layer of the quartz glass crucible based on a distribution of the blue fluorescence in the outer layer of the quartz glass crucible.

The present invention allows easy and nondestructive evaluation on the distribution of the oxygen deficiency defect in the outer layer of the quartz glass crucible based on the distribution of the blue fluorescence.

The method for evaluating the quartz glass crucible according to the present invention allows the use of the blue fluorescence having a peak at approximately 395 nm wavelength.

The method for evaluating the quartz glass crucible according to the present invention allows the use of the ultraviolet rays for irradiation to have a peak at approximately 254 nm wavelength.

In the inventive method for evaluating the quartz glass crucible, the use of ultraviolet rays having a peak at approximately 254 nm wavelength allows detection of the blue fluorescence generated as the fluorescence having the peak at approximately 395 nm wavelength. This makes it possible to easily evaluate the state of the oxygen deficiency defect in the outer layer formed of the opaque quartz glass.

It is preferred that the blue fluorescence is detected based on a definition that the blue fluorescence has been detected when a following formula (1) is satisfied:

$$(A/B)\times 1000\geq 20 \quad \text{formula (1)},$$

where A denotes a peak intensity of the blue fluorescence, and B denotes a peak intensity of a Rayleigh-scattering light caused by irradiation of the ultraviolet rays, which have been measured.

The detection or non-detection of the blue fluorescence is defined by the blue fluorescence intensity, taking the Rayleigh-scattering light of the incident light as the norm. This makes it possible to evaluate the state of the oxygen deficiency detect in the outer layer formed of the opaque quartz glass further objectively.

It is preferred that an irradiation angle of the ultraviolet rays is set to an angle shifted from a direction perpendicular to an inner surface of the quartz glass crucible, and the blue fluorescence is detected at an angle shifted from a regular reflection light of the ultraviolet rays.

The irradiation angle of the irradiation light, and the blue fluorescence detection angle are set as above to allow detection of the Rayleigh-scattering light and the blue fluorescence by excluding the influence of the regular reflection light of the irradiation light.

In the inventive method for evaluating the quartz glass crucible, it is preferred that the quartz glass crucible is evaluated nondestructively.

The present invention allows nondestructive and easy evaluation on the state of the oxygen deficiency defect in the outer layer of the quartz glass crucible. Accordingly, the quartz glass crucible is evaluated nondestructively to allow quick provision of the evaluation result as well as total evaluation of the quartz glass crucibles.

It is preferred that the quartz glass crucible to be evaluated has the inner layer formed using a raw material silica powder doped with hydrogen, or the inner layer additionally introduced with moisture.

The inventive method for evaluating a quartz glass crucible is especially suitable for evaluating the quartz glass crucible formed by using the hydrogen doped raw material silica powder for forming the inner layer, and the quartz glass crucible having the inner layer introduced with moisture. This makes it possible to easily evaluate the state of the oxygen deficiency defect in the outer layer of the quartz glass crucible as above.

The present invention provides a method for manufacturing a quartz glass crucible. The method includes a stage of manufacturing a quartz glass crucible that includes an outer layer formed of an opaque quartz glass containing a bubble and an inner layer formed of a transparent quartz glass, a stage of evaluating the manufactured quartz glass crucible as the quartz glass crucible to be evaluated by the method for evaluating a quartz glass crucible according to any one of those described above, a stage of setting a manufacturing condition for newly manufacturing a quartz glass crucible based on a result of evaluating a state of oxygen deficiency defects in the outer layer of the manufactured quartz glass crucible, and a stage of newly manufacturing the quartz glass crucible under the set manufacturing condition.

The inventive method for evaluating the quartz glass crucible allows feedback of the evaluation result to manufacturing of the quartz glass crucible. The inventive method for evaluating the quartz glass crucible can be implemented nondestructively and easily to immediately provide the feedback to manufacturing of the quartz glass crucible, resulting in improved productivity and quality.

The present invention has been made to solve the problem as above, and provides the quartz glass crucible constituted by a bottom portion, a curved portion and a straight body portion. The quartz glass crucible includes an outer layer formed of an opaque quartz glass containing a bubble and an inner layer formed of a transparent quartz glass. When the quartz glass crucible is irradiated with ultraviolet rays as an excitation light, a blue fluorescence is generated in a boundary region between the outer layer and the inner layer of the quartz glass crucible. The blue fluorescence is generated entirely over the bottom portion, the curved portion, and the straight body portion of the quartz glass crucible.

The quartz glass crucible as above can be formed to satisfactorily suppress generation of the bubble in the surface part of the inner layer over the entire surface.

In this case, the inventive quartz glass crucible includes the outer layer containing the natural quartz glass, and the inner layer containing the synthetic quartz glass. The blue fluorescence can be generated in a region where the natural quartz glass comes into contact with the synthetic quartz glass.

The quartz glass crucible structured to include the outer layer containing the natural quartz glass and the inner layer containing the synthetic quartz glass satisfies the condition of generating the blue fluorescence over the entire surface. The present invention ensures to provide the above-structured quartz glass crucible that satisfactorily suppresses generation of the bubble in the surface part of the inner layer over the entire surface.

The inner layer of the inventive quartz glass crucible may contain the quartz glass doped with hydrogen, or the quartz glass introduced with water vapor.

The quartz glass crucible including the inner layer that contains the hydrogen doped quartz glass, or the quartz glass introduced with water vapor especially satisfies the condition of generating the blue fluorescence over the entire surface favorably. The hydrogen doped quartz glass and the quartz glass introduced with water vapor may be used for suppressing generation of bubbles. The inventive quartz glass crucible in which the blue fluorescence is observed over the entire surface more securely suppresses generation of bubbles in the surface part of the inner layer over the entire surface satisfactorily.

In the inventive quartz glass crucible, the blue fluorescence may have a peak at approximately 395 nm wavelength.

In the inventive quartz glass crucible, the ultraviolet rays for irradiation may have a peak at approximately 254 nm wavelength.

The blue fluorescence in the inventive quartz glass crucible may be identified by detecting the blue fluorescence generated as the fluorescence having a peak at approximately 395 nm wavelength using ultraviolet rays having a peak at approximately 254 nm wavelength.

Advantageous Effects of Invention

The inventive method for evaluating a quartz glass crucible allows nondestructive and easy evaluation on the state of the oxygen deficiency defect in the outer layer of the quartz glass crucible, which reflects the condition of the hydrogen doping and the water vapor introduction based on existence or non-existence of the blue fluorescence. The inner layer of the quartz glass crucible can be quickly evaluated to improve the productivity without requiring destruction of the quartz glass crucible as the product. The use of the inventive method for evaluating the quartz glass crucible allows feedback of the evaluation result to manufacturing of the quartz glass crucible. The inventive method for evaluating the quartz glass crucible can be implemented nondestructively and easily. This may immediately provide the feedback to manufacturing of the quartz glass crucible.

The blue fluorescence is observed over the entire surface of the inventive quartz glass crucible. Accordingly, the quartz glass crucible may be made to have generation of bubbles in the surface part of the inner layer satisfactorily suppressed over the entire surface.

BRIEF DESCRIPTION OF DRAWINGS

FIG. 1 is a flowchart briefly representing a method for evaluating the inventive quartz glass crucible.

FIG. 2 is a graph representing each relation between intensity of the blue fluorescence and a bubble density exposed on the inner surface after VBT, derived from Experimental Examples 1-1 to 1-8.

FIG. 3 shows photos taken in Experimental Examples 2-1 and 2-2, indicating generation status of the blue fluorescence, and generation status of the bubble after VBT on the respective positions of the quartz glass crucible.

FIG. 4 shows photos taken in Example 1, indicating emission of the blue fluorescence observed after irradiation of the quartz glass crucible with ultraviolet rays by following the inventive method for evaluating the quartz glass crucible.

FIG. 5 is a schematic cross-sectional view representing the respective portions of a generally employed quartz glass crucible.

FIG. 6 is a flowchart briefly representing a method for detecting the blue fluorescence of the quartz glass crucible.

DESCRIPTION OF EMBODIMENTS

First Embodiment of Present Invention

A method for evaluating the quartz glass crucible, and a method for manufacturing the same according to a first embodiment of the present invention will be described hereinafter.

If the inner layer of the quartz glass crucible is not sufficiently doped with hydrogen as above, generally, there may be the case that an effect for suppressing bubble expansion has not been sufficiently obtained. In order to locate the subject position, the heat treatment evaluation has to be performed by executing the cut-out process. Such method cannot be implemented easily within a short period of time.

According to the research by the present inventors, the position insufficiently doped with hydrogen is considered to have been caused by the mechanism as described below. If the hydrogen doped silica powder as the raw material powder is scattered by the scattering method, and adhered to the quartz glass crucible base, two parts coexist, one of which is formed by directly adhering the raw material powder, and the other is formed under an inertial force in the melting process (formed as a result of movement of the adhered raw material powder in the glass state). The hydrogen concentration of the part formed under the inertial force is lowered, and a sufficient bubble suppression effect cannot be obtained. In order to distinguish those parts, the heat treatment evaluation has been generally required by executing the cut-out process as described above. With the generally employed method, a sample is cut out from the quartz glass crucible. The sample is then actually heated to generate bubbles to inspect variation in the hydrogen doped state. This method is implemented destructively, thus requiring much time. For example, implementation of this method takes approximately ten hours in total, specifically, one hour for destruction and marking of the quartz glass crucible, one hour for cutting the sample, half an hour for executing the preprocessing, five hours for conducting the VBT (Vacuum Bakeout Test) including warming-up, three hours for cooling, and half an hour for evaluation. In this case, the evaluation takes much time. The manufacturing has to be interrupted during evaluation for the feedback, thus deteriorating productivity.

In order to solve the problem, the present inventors have focused on the oxygen deficiency defect generated in the outer layer of the quartz glass crucible when using the hydrogen doped silica powder as the raw material powder for manufacturing the quartz glass crucible. The use of the hydrogen doped silica powder diffuses hydrogen from the inner layer (transparent silica glass layer) to the outer layer (opaque silica glass layer) of the quartz glass crucible. The hydrogen is combined with oxygen taken from the silica and a melt atmosphere, which may be the main cause of bubbles generated in the outer layer, resulting in the oxygen deficiency defect. In the presence of the oxygen deficiency defect, irradiation of ultraviolet rays generates the fluorescence (blue fluorescence) to show a state of the oxygen deficiency defect in the outer layer of the quartz glass crucible, and further the hydrogen doped state. The blue fluorescence, in other words, the oxygen deficiency defect is generated in a shallow part in the outer layer side of the boundary region between the inner layer and the outer layer. The blue fluorescence does not necessarily occur over the entire area of the outer layer in the depth direction. Those findings have led the present inventors to the first embodiment of the present invention.

Hereinafter, the first embodiment according to the present invention will be described more specifically. Provided is the inventive method for evaluating the quartz glass crucible which includes the outer layer formed of the opaque quartz glass containing the bubble, and the inner layer formed of the transparent quartz glass. The method includes the step of preparing the quartz glass crucible to be evaluated, the step of irradiating the quartz glass crucible to be evaluated with ultraviolet rays as the excitation light, the step of detecting a blue fluorescence emitted from the quartz glass crucible irradiated with the ultraviolet rays, and the step of evaluating the state of oxygen deficiency defects in the outer layer of the quartz glass crucible on the basis of existence or non-existence of the blue fluorescence.

Referring to FIG. 5, each part constituting a generally employed quartz glass crucible is described. A quartz glass crucible 10 as illustrated in FIG. 5 includes an outer layer 21 formed of an opaque quartz glass containing bubbles, and an inner layer 22 formed of a transparent quartz glass. As FIG. 5 illustrates, the quartz glass crucible 10 is typically formed into a crucible shape constituted by a bottom portion 12, a curved portion 13, and a straight body portion 14. A bottom center 11 is positioned at the center of the bottom portion 12. The bottom portion 12 is called a large-R portion, and the curved portion 13 is called a small-R portion.

FIG. 1 briefly represents the inventive method for evaluating the quartz glass crucible. As step S1 indicates, a quartz glass crucible to be evaluated is prepared. A commercially available quartz glass crucible may be used as the one to be prepared. The inventive method for evaluating the quartz glass crucible is suitable for evaluating the state of the oxygen deficiency defect of the quartz glass crucible having the inner layer 22 formed by using the hydrogen doped raw material silica powder, or the inner layer 22 additionally introduced with a moisture content. Besides the quartz glass crucible having the inner layer 22 entirely doped with hydrogen or moisture, the present invention is applicable to the quartz glass crucible having the inner layer partially doped with hydrogen and moisture without any problems.

As step S2 indicates, the quartz glass crucible to be evaluated is irradiated with ultraviolet rays as an excitation light. Then as step S3 indicates, the blue fluorescence emitted from the quartz glass crucible irradiated with ultraviolet rays is detected. It is preferred that ultraviolet rays for irradiation have a peak at approximately 254 nm wavelength. In such a case, the blue fluorescence to be detected has a peak at approximately 395 nm wavelength. The ultraviolet rays at approximately 254 nm wavelength can be easily derived from a mercury lamp. With the inventive method for evaluating the quartz glass crucible, the use of ultraviolet rays having a peak at approximately 254 nm wavelength detects the blue fluorescence as the fluorescence having a peak at approximately 395 nm wavelength to allow easy evaluation on the state of the oxygen deficiency defect in the outer layer formed of the opaque quartz glass. In the case of the silica glass, it is known that the fluorescence having a peak at approximately 395 nm wavelength is generated owing to the oxygen deficiency defect (B213). In most cases, the peak of the fluorescence at approximately 395 nm wavelength ranges from 394 nm to 396 nm. The peak may also vary to a certain extent, ranging from 390 nm to 400 nm approximately depending on the measurement device.

As step S4 indicates, the oxygen deficiency defect state in the outer layer of the quartz glass crucible is evaluated based on existence or non-existence of the blue fluorescence. The blue fluorescence generated by executing steps S2 and S3 indicates presence of the oxygen deficiency defect. No generation of the blue fluorescence indicates absence of the oxygen deficiency defect or a low density.

The inventive method for evaluating the quartz glass crucible allows nondestructive and easy evaluation of the state of the oxygen deficiency defect in the outer layer formed of the opaque quartz glass of the quartz glass crucible based on existence or non-existence of the blue fluorescence. The oxygen deficiency defect in the outer layer reflects the hydrogen doped state or water vapor introduction state in the inner layer. Accordingly, the inventive method for evaluating the quartz glass crucible allows nondestructive and easy evaluation on the hydrogen doped state and the water vapor introduction state. As described above, the blue fluorescence, in other words, the oxygen deficiency defect is generated in the shallow part in the outer layer side of the boundary region between the inner layer and the outer layer. For example, when the natural quartz powder is used as the raw material silica powder for the outer layer, and the synthetic quartz powder is used as the raw material silica powder for the inner layer, the outer layer becomes the natural quartz glass layer. At this time, oxygen in the outer layer (natural quartz glass layer) is combined with hydrogen taken from the doped hydrogen and the introduced water vapor to form a natural transparent layer with few bubbles in the presence of the oxygen deficiency defect. The natural transparent layer is the cause of the blue fluorescence. The blue fluorescence is not necessarily generated over the entire area of the outer layer in the thickness direction.

The state of the oxygen deficiency defect of the entire or a partial area of the outer layer of the quartz glass crucible can be evaluated by executing steps S1 to S4 described above. Evaluation of the quartz glass crucible having the inner layer formed using the hydrogen doped raw material silica powder clarifies the hydrogen doped state in the inner layer by the scattering method. This allows immediate feedback to manufacturing. Evaluation of the quartz glass crucible having the inner layer additionally introduced with moisture also clarifies the state of the inner layer added with moisture. This allows immediate feedback to manufacturing as well.

Specifically, in the method for manufacturing the quartz glass crucible, the feedback can be provided as follows. The quartz glass crucible 10 (see FIG. 5) constituted by the outer layer 21 formed of the opaque quartz glass containing the bubble and the inner layer 22 formed of the transparent quartz glass is manufactured by the generally employed method (stage A). Then the manufactured quartz glass crucible as an evaluation target is evaluated using the inventive method for evaluating the quartz glass crucible by following the steps S1 to S4 (stage B). In the stage B, based on the result of evaluating the state of the oxygen deficiency defect in the outer layer 21 of the manufactured quartz glass crucible 10, manufacturing conditions are set for newly manufacturing the quartz glass crucible (stage C). Then the quartz glass crucible is newly manufactured under the manufacturing conditions set in the stage C (stage D).

The inventive method for evaluating the quartz glass crucible allows feedback of the evaluation results to manufacturing of the quartz glass crucible. As the quartz glass crucible can be evaluated nondestructively and easily by the inventive method, the feedback can be immediately provided to manufacturing of the quartz glass crucible, resulting in improved productivity. The inventive method for evaluating the quartz glass crucible shows the fluorescence state in the outer layer of the quartz glass crucible in the cold state after the melting process. This makes it possible to clarify the state of the oxygen deficient defect in the outer layer, and further the hydrogen doped state or moisture introduction state in the inner layer, resulting in the immediate feedback to manufacturing. Conventionally, the time required for obtaining the evaluation results from the end of the melting process is approximately ten hours, for example. According to the present invention, the time to be taken until provision of the feedback is approximately one hour. The present invention requires no destructive evaluation and thus allows the total evaluation.

The inventive method for evaluating the quartz glass crucible allows visual confirmation of the blue fluorescence. Specifically, the quartz glass crucible is irradiated with ultraviolet rays in a darkroom to allow confirmation of generation of the blue fluorescence. It is also possible to visually confirm a distribution of the blue fluorescence in the outer layer of the quartz glass crucible.

The inventive method for evaluating the quartz glass crucible may be implemented on the basis of the definition that the blue fluorescence has been detected quantitatively based on numerical values as described below more specifically. The peak intensity (peak height) of the blue fluorescence generated by irradiation of ultraviolet rays as the excitation light is measured as the peak intensity A. The peak intensity (peak height) of a Rayleigh-scattering light generated by irradiation of ultraviolet rays is measured as the peak intensity B. If the values A and B satisfy the following formula (1), it can be defined that the blue fluorescence has been detected:

$$(A/B)\times 1000 \geq 20 \quad \text{Formula (1).}$$

As described above, the blue fluorescence can be detected without relying on the visual confirmation. The formula (1) as above has been set for the following reasons.

Patent Documents 6 and 7 disclose measurement of the red fluorescence for detecting an excessive oxygen defect in the quartz glass crucible. In the case of the red fluorescence, the Raman scattering light and the fluorescence are measured using an Ar laser beam at 514 nm wavelength as the excitation light.

In the case of the blue fluorescence, ultraviolet rays at 254 nm wavelength are used as the excitation light. Because of the resultant fluorescent wavelength of 395 nm, the same measurement method as the one employed for the red fluorescence cannot be used. The fluorescence intensity varies depending on the excitation light intensity. It is therefore preferred to standardize the measurement by the intensity ratio. Standardization requires the excitation light intensity. The excitation light intensity, however, is not kept constant as it varies depending on the apparatus, or it is deteriorated over time. The Rayleigh-scattering light at the same wavelength as the one generated by the excitation light is employed as the norm. In principle, the Rayleigh-scattering light has the same wavelength as that of the incident light. In most cases, however, the wavelength may slightly differ depending on the measurement device, while having the peak ranging from 253 nm to 256 nm approximately.

Even if the Rayleigh-scattering light is employed as the norm as described above, a light receiving section may receive the regular reflection light of the excitation light, which is unnecessary for the measurement. Accordingly, it is preferred that the irradiation angle of ultraviolet rays is set to an angle shifted from a direction perpendicular to an inner surface of the quartz glass crucible, and the blue fluorescence is detected at an angle shifted from the regular reflection light of ultraviolet rays. For example, the irradiation surface of the quartz glass crucible is tilted to set the incident angle of the excitation light to 60° to allow the measurement by a fluorescence spectrophotometer.

Experimental examples which have derived the formula (1) are described below.

Experimental Examples 1-1 to 1-8

The generally employed quartz glass crucible 10 as illustrated in FIG. 5 was manufactured using a hydrogen doped synthetic quartz powder as the raw material powder for forming the inner layer 22. Eight pieces of similar quartz glass crucibles 10 were manufactured while changing manufacturing conditions (Experimental Examples 1-1 to 1-8).

Preparation of Sample

Measurement samples were cut out from the inner layers 22 at the straight body portions 14 of the respective quartz glass crucibles 10 manufactured in the Experimental Examples 1-1 to 1-8.

Measurement of Blue Fluorescence

Each sample was irradiated with ultraviolet rays having a peak at approximately 254 nm wavelength for detecting the blue fluorescence having a peak at approximately 395 nm wavelength. The FP-8500 spectrofluorometer manufactured by JASCO Corporation was used as the measurement device. The measurement was performed by tilting the irradiation surface of the quartz glass crucible to set the incident angle of the excitation light to 60°. The measurement condition was determined to attain sensitivity which allows measurement of the peak intensity of the Rayleigh-scattering light. The Rayleigh-scattering light intensity relies on the wavelength of the incident light. The intensity is approximately 0.1% of the incident light intensity at 254 nm wavelength. The peak intensity ratio standardized by the formula (1) was used as the fluorescence intensity ratio based on the peak intensity A of the blue fluorescence and the peak intensity B of the Rayleigh-scattering light.

Measurement of Bubble Density

After measurement of the blue fluorescence, the samples of the quartz glass crucible 10 prepared in Experimental Examples 1-1 to 1-8 were subjected to measurement of bubble density after VBT as the generally employed evaluation method. Each sample was held for two hours and ten minutes at 1650° C. at the vacuum degree of $2\times10^{-2}$ Pa or lower to generate bubbles. Thereafter, each bubble density exposed on surfaces of the respective samples was visually confirmed.

Results of Experimental Examples 1-1 to 1-8 are shown in Table 1 and FIG. 2.

TABLE 1

| | Fluorescence intensity ratio (A/B) × 1000 | Bubble density exposed on inner surface after VBT [pcs/cm$^2$] |
|---|---|---|
| Experimental example 1-1 | 41.1 | 0.07 |
| Experimental example 1-2 | 6.9 | 0.70 |
| Experimental example 1-3 | 20.9 | 0.05 |
| Experimental example 1-4 | 13.5 | 0.45 |
| Experimental example 1-5 | 63.7 | 0.10 |
| Experimental example 1-6 | 0.5 | 0.63 |
| Experimental example 1-7 | 24.8 | 0.12 |
| Experimental example 1-8 | 5.3 | 0.64 |

As Table 1 and FIG. 2 represent, in the case where the fluorescence intensity ratio (A/B)×1000 is equal to or higher than 20, the bubble density after VBT has been largely suppressed. Accordingly, if the formula (1) is satisfied, it can be determined that the substantial oxygen deficiency defect exists.

If it is difficult to measure the fluorescence intensity without destructing the quartz glass crucible, the fluorescence of the quartz glass crucible is confirmed as follows. A standard sample with the fluorescence intensity of 20 or higher, derived from the formula (1) is used for comparison with the respective samples to identify the quality state (the oxygen deficiency defect status in the outer layer) in the inner layer of the quartz crucible.

When providing the feedback to the condition of manufacturing the quartz glass crucible subsequently using the standard sample, the feedback can be provided as follows, for example.

If the fluorescence of the sample has equivalent or higher intensity compared with the standard sample, the manufactured quartz glass crucible is made an acceptable product, and delivered to the next step.

Meanwhile, if the fluorescence of the sample has the lower intensity compared with the standard sample, the feedback is provided to the manufacturing conditions of the quartz crucible to be manufactured next. For example, the manufacturing conditions are set to directly adhere the hydrogen doped raw material powder to the part having the fluorescence with low intensity.

The quartz glass crucible having the fluorescence with low intensity may be made unusable for the product. This is because the only way to actually check the bubble suppression effect is to destroy it.

The inventive evaluation method using the blue fluorescence of the quartz glass crucible allows identification of the entire state of the quartz glass crucible as well as immediate feedback to the next manufacturing.

Referring to Experimental Examples 2-1 and 2-2, explanations will be made with respect to a correlation between the visual observation of the blue fluorescence and the bubble generation status after VBT in the inventive method for evaluating the quartz glass crucible.

Experimental Example 2-1

The generally employed quartz glass crucible 10 as illustrated in FIG. 5 was manufactured using the hydrogen doped synthetic quartz powder as the raw material powder for the inner layer 22 by the similar methods to those employed in Experimental Examples 1-1 to 1-8 while slightly changing the manufacturing conditions (Experimental Example 2-1).

Preparation of Sample

Samples each size of approximately 4 cm×8 cm were cut out at an interval of 100 mm from the bottom center 11 to the straight body portion 14 of the prepared quartz glass crucible 10. A position at a distance of 0 mm (bottom center) from the bottom center 11 indicates the position which contains the bottom center 11. Each position at a distance of 100 mm, 200 mm, and 300 mm from the bottom center 11 is located on the bottom portion 12 (that is, the large-R portion). A position at a distance of 400 mm from the bottom center 11 is located on the curved portion 13 (that is, the small-R portion). Each position at a distance of 500 mm, 600 mm, and 700 mm from the bottom center 11 is located on the straight body portion 14. The position at the distance of 500 mm from the bottom center 11 is located around the lower section of the straight body portion 14.

Measurement of Blue Fluorescence

Each sample was irradiated with ultraviolet rays having a peak at approximately 254 nm wavelength to visually confirm existence or non-existence of generation of the blue fluorescence having a peak at approximately 395 nm wavelength. FIG. 3 shows photos representing each state of the samples irradiated with ultraviolet rays in a row titled "fluorescence generation status". Referring to FIG. 3, the blue fluorescence appears as a bright part at the left side of each sample. No blue fluorescence was observed in the position of the bottom portion 12 (that is, the large-R portion) at the distance of 300 mm from the bottom center 11, and the positions of the straight body portion 14 at the distance of 500 mm, 600 mm, 700 mm.

Measurement of Bubble Density

After the measurement of the blue fluorescence, each sample of the quartz glass crucible 10 prepared in Experimental Example 2-1 was subjected to the measurement of bubble density after VBT as the generally employed evaluation method. Each sample was held for two hours and ten minutes at 1650° C. at the vacuum degree of $2\times10^{-2}$ Pa or lower to generate bubbles. Thereafter, each bubble density exposed on surfaces of the respective samples was visually confirmed. Each position of the sample in the presence of the bubble was marked as shown in the row of FIG. 3 (the row titled "Bubble generation status after VBT"). Positions at which no blue fluorescence was observed (each at the distance of 300 mm, 500 mm, 600 mm, 700 mm from the bottom center 11) had the number of exposed bubbles more than the number of those at other positions. This means that such positions are not sufficiently doped with hydrogen, that is, insufficient effect for suppressing bubble generation.

Experimental Example 2-2

The generally employed quartz glass crucible 10 as illustrated in FIG. 5 was manufactured using the hydrogen doped synthetic quartz powder as the raw material powder for the inner layer 22 by the similar methods to those employed in Experimental Examples 1-1 to 1-8, and 2-1 while slightly changing the manufacturing condition Experimental Example 2-2).

The quartz glass crucible 10 prepared in Experimental Example 2-2 was subjected to a series of processes for preparing samples, measuring the blue fluorescence, and measuring the bubble density similarly to Experimental Example 2-1. FIG. 3 shows the results of the experiment. In Experimental Example 2-2, the blue fluorescence was observed in all the samples. In the bubble generation testing after VBT, generation of bubbles was suppressed in all the samples.

Results derived from Experimental Examples 2-1, 2-2 show that the visual observation of the blue fluorescence is correlated with the bubble generation status after VBT.

Second Embodiment of Present Invention

A quartz glass crucible according to a second embodiment of the present invention will be described below.

As described above, when the inner layer of the quartz glass crucible was not sufficiently doped with hydrogen, generally, sufficient effect for suppressing bubble expansion could not be obtained. In particular, there were cases where the state of hydrogen doping varied depending on the part of the quartz glass crucible. In other words, the state of bubbles contained inside the inner layer of the quartz glass crucible was not uniform. Findings from the study of the present inventors have clarified the specific position which is likely to cause inclusion of bubbles. The respective portions of the quartz glass crucible have been evaluated by executing the cut-out process and the vacuum heat treatment process based on the estimation from the past results. For example, the evaluation has been made by the "VBT" as disclosed in Patent Document 8 under the condition for holding the sample for two hours and ten minutes at 1650° C. at the vacuum degree of $2\times10^{-2}$ Pa or lower. It has not been clarified so far by what the bubble included in the synthetic transparent layer is affected.

According to the research by the present inventors, the "hydrogen" included in the inner layer (in most cases, the synthetic transparent layer) formed of the hydrogen doped silica powder diffuses into the outer layer (in most cases, the natural bubble layer formed of the natural quartz powder). The hydrogen is combined with oxygen existing in the outer layer in a large volume to form a thin natural layer containing fewer bubbles (hereinafter referred to as "natural transparent layer"). The natural transparent layer with the oxygen deficiency defect emits the blue fluorescence in response to irradiation of ultraviolet rays at 254 nm wavelength.

In the course of studying, the present inventors have found that the quartz glass crucible is constituted by a part having the blue fluorescence emitted therein, and the other part having no blue fluorescence emitted therein. When performing the VBT both in the part having the blue fluorescence emitted therein, and the part having no blue fluorescence emitted therein, they found that the surface part of the synthetic transparent layer of the part having the fluorescence emitted therein exhibited excellent effect for suppressing bubbles.

Similar to the explanation on the first embodiment of the present invention, according to the research by the present inventors, the portion insufficiently doped with hydrogen is considered to have been caused by the mechanism as described below. If the hydrogen doped silica powder as the raw material powder is scattered by the scattering method, and adhered to the quartz glass crucible base, two parts coexist, one of which is formed by directly adhering the raw material powder, and the other is formed under an inertial force in the melting process (formed as a result of movement of the adhered raw material powder in the glass state). The hydrogen concentration of the part formed under the inertial force is lowered, and a sufficient bubble suppression effect cannot be obtained.

In order to solve the problem, the present inventors focused on the oxygen deficiency defect generated in the outer layer of the quartz glass crucible when using the hydrogen doped silica powder as the raw material powder for manufacturing the quartz glass crucible. The use of the hydrogen doped silica powder diffuses hydrogen from the inner layer (transparent silica glass layer) to the outer layer (opaque silica glass layer) of the quartz glass crucible. The hydrogen is combined with oxygen taken from the silica and a melt atmosphere, which may be the main cause of bubbles generated in the outer layer, resulting in the oxygen deficiency defect. In the presence of the oxygen deficiency defect, irradiation of ultraviolet rays generates the fluorescence (blue fluorescence) to show a state of the oxygen deficiency defect in the outer layer of the quartz glass crucible, and further the hydrogen doped state. The blue fluorescence, in other words, the oxygen deficiency defect is generated in a shallow part in the outer layer side of the boundary region between the inner layer and the outer layer. The blue fluorescence does not necessarily occur over the entire area of the outer layer in the depth direction. Those findings have led the present inventors to the second embodiment of the present invention.

Hereinafter, the second embodiment according to the present invention will be described more specifically. The inventive quartz glass crucible is constituted by the bottom portion, the curved portion and the straight body portion. The quartz glass crucible includes the outer layer formed of an opaque quartz glass containing a bubble and the inner layer formed of a transparent quartz glass. When the quartz glass crucible is irradiated with ultraviolet rays as the excitation light, the blue fluorescence is generated in the boundary region between the outer layer and the inner layer of the quartz glass crucible. The blue fluorescence is generated entirely over the bottom portion, the curved portion, and the straight body portion of the quartz glass crucible.

Referring to FIG. 5, each part constituting the inventive quartz glass crucible is described. A quartz glass crucible 10 as illustrated in FIG. 5 includes the outer layer 21 formed of an opaque quartz glass containing bubbles, and the inner layer 22 formed of a transparent quartz glass. As FIG. 5 illustrates, the quartz glass crucible 10 is typically formed into a crucible shape constituted by the bottom portion 12, the curved portion 13, and the straight body portion 14. The bottom center 11 is positioned at the center of the bottom portion 12. The bottom portion 12 is called the large-R portion, and the curved portion 13 is called the small-R portion.

As described above, the inventive quartz glass crucible 10 is designed to generate the blue fluorescence in the boundary region between the outer layer 21 and the inner layer 22 of the quartz glass crucible 10 when it is irradiated with ultraviolet rays as the excitation light. The blue fluorescence is generated over an entire area which covers the bottom portion 12, the curved portion 13, and the straight body portion 14 of the quartz glass crucible 10. The quartz glass crucible 10 is formed to satisfactorily suppress generation of bubbles over the entire surface part of the inner layer 22.

The inventive quartz glass crucible 10 may be constituted by the outer layer 21 which contains the natural quartz glass, and the inner layer 22 which contains the synthetic quartz glass. The above-structured quartz glass crucible has been generally used especially for pulling the silicon single crystal. In the above-structured quartz glass crucible 10, generally, the blue fluorescence is generated in the region where the natural quartz glass comes into contact with the synthetic quartz glass.

It is preferred that the inner layer 22 of the inventive quartz glass crucible 10 contains the hydrogen doped quartz glass, or the quartz glass introduced with water vapor. Especially, according to the present invention, the quartz glass crucible with the inner layer containing the hydrogen doped quartz glass or the quartz glass introduced with water vapor favorably attains generation of the blue fluorescence over the entire surface. The hydrogen doped quartz glass or the quartz glass introduced with water vapor is used for suppressing generation of bubbles. The inventive quartz glass crucible in which the blue fluorescence is observed over the entire surface more securely suppresses generation of bubbles over the entire surface part of the inner layer satisfactorily.

Method for Detecting Blue Fluorescence

The blue fluorescence generated in the inventive quartz glass crucible is detected by the following procedures, for example. As step S21 in FIG. 6 indicates, the quartz glass crucible is prepared.

As step S22 in FIG. 6 indicates, the quartz glass crucible is irradiated with ultraviolet rays as an excitation light. Then as step S23 in FIG. 6 indicates, the blue fluorescence emitted from the quartz glass crucible irradiated with ultraviolet rays is detected. It is preferred that ultraviolet rays for irradiation have a peak at approximately 254 nm wavelength. In such a case, the blue fluorescence to be detected has a peak at approximately 395 nm wavelength. The ultraviolet rays at approximately 254 nm wavelength can be easily derived from the mercury lamp. With the inventive method for evaluating the quartz glass crucible, the use of ultraviolet rays having a peak at approximately 254 nm wavelength detects the blue fluorescence as the fluorescence having a peak at approximately 395 nm wavelength to allow easy evaluation on the state of the oxygen deficiency defect in the outer layer formed of the opaque quartz glass. In the case of the silica glass, it is known that the fluorescence having a peak at approximately 395 nm wavelength is generated owing to the oxygen deficiency defect (B2β). In most cases, the peak of the fluorescence at approximately 395 nm wavelength ranges from 394 nm to 396 nm. The peak may also vary to a certain extent, ranging from 390 nm to 400 nm approximately depending on the measurement device.

The blue fluorescence generated by executing steps S22 and S23 indicates presence of the oxygen deficiency defect. No generation of the blue fluorescence indicates absence of the oxygen deficiency defect, or low density.

The method for detecting the blue fluorescence allows the quartz glass crucible to be nondestructively and easily evaluated. As described above, the blue fluorescence, in other words, the oxygen deficiency defect is typically generated in the shallow part in the side of the outer layer 21 of the boundary region between the inner layer 22 and the outer layer 21. For example, when the natural quartz powder is used as the row material silica powder for the outer layer 21, and the synthetic quartz powder is used as the raw material silica powder for the inner layer 22, the outer layer 21 becomes the natural quartz glass layer. At this time, oxygen in the outer layer 21 (natural quartz glass layer) is combined with hydrogen introduced from the hydrogen doping and water vapor introduction to form a natural transparent layer with few bubbles and oxygen deficiency defect. The natural transparent layer is the cause of generating the blue fluorescence. The blue fluorescence is not necessarily generated over the entire outer layer 21 in the thickness direction.

The blue fluorescence can be visually confirmed. Specifically, the quartz glass crucible is irradiated with ultraviolet rays in the darkroom to allow confirmation of generation of the blue fluorescence. It is also possible to visually confirm a distribution of the blue fluorescence in the outer layer of the quartz glass crucible.

The blue fluorescence may be detected on the basis of the definition that the blue fluorescence is detected quantitatively based on numerical values as described below more specifically. The peak intensity (peak height) of the blue fluorescence generated by irradiation of ultraviolet rays as the excitation light is measured as the peak intensity A. The peak intensity (peak height) of a Rayleigh-scattering light generated by irradiation of ultraviolet rays is measured as the peak intensity B. If the values A and B satisfy the following formula (1), it can be defined that the blue fluorescence has been detected:

$$(A/B)\times 1000\geq 20 \qquad \text{Formula (1).}$$

As described above, the blue fluorescence can be detected without relying on the visual confirmation. The formula (1) as above has been set for the following reasons similar to those of the first embodiment of the present invention.

Patent Documents 6 and 7 disclose measurement of the red fluorescence for detecting an excessive oxygen defect in the quartz glass crucible. In the case of the red fluorescence, the Raman scattering light and the fluorescence are measured using an Ar laser beam with 514 nm wavelength as the excitation light.

In the case of the blue fluorescence, ultraviolet rays at 254 nm wavelength are used as the excitation light. Because of the resultant fluorescent wavelength of 395 nm, the same measurement method as the one employed for the red fluorescence cannot be used. The fluorescence intensity varies depending on the excitation light intensity. It is therefore preferred to standardize the measurement by the intensity ratio. Standardization requires the excitation light intensity. The excitation light intensity, however, is not kept constant as it varies depending on the apparatus, or it is deteriorated over time. The Rayleigh-scattering light with the same wavelength as that of the excitation light is employed as the norm. In principle, the Rayleigh-scattering light has the same wavelength as that of the incident light. In most cases, however, the wavelength may slightly differ depending on the measurement device, while having the peak ranging from 253 nm to 256 nm wavelength approximately.

Even if the Rayleigh-scattering light is employed as the norm as described above, a light receiving section may receive the regular reflection light of the excitation light, which is unnecessary for the measurement. Accordingly, it is preferred that the irradiation angle of ultraviolet rays is set to an angle shifted from a direction perpendicular to an inner surface of the quartz glass crucible, and that the blue fluorescence is detected at an angle shifted from the regular reflection light of ultraviolet rays. For example, the irradiation surface of the quartz glass crucible is tilted to set the incident angle of the excitation light to 60° to allow the measurement by the fluorescence spectrophotometer.

A relation between detection of the blue fluorescence and the bubble density in the present invention is described referring to Experimental Examples.

Experimental Examples 3-1 to 3-8

The generally employed quartz glass crucible 10 as illustrated in FIG. 5 was manufactured using the hydrogen doped synthetic quartz powder as the raw material powder for forming the inner layer 22 (hydrogen doped synthetic quartz powder as disclosed in Patent Document 3). Samples were cut out from multiple portions of the manufactured quartz glass crucible 10 (Experimental Examples 3-1 to 3-8).

Measurement of Blue Fluorescence

Each sample was irradiated with ultraviolet rays having a peak at approximately 254 nm wavelength for detecting the blue fluorescence having a peak at approximately 395 nm wavelength. The samples each having the blue fluorescence detected were prepared in Experimental Examples 3-1 to 3-4, and the samples each having no blue fluorescence detected were prepared in Experimental Examples 3-5 to 3-8.

Measurement of Bubble Density

After measurement of the blue fluorescence, the samples of the quartz glass crucible 10 prepared in the Experimental Examples 3-1 to 3-8 were subjected to the measurement of bubble density after VBT based on the evaluation method disclosed in Patent Document 8. Each sample was held for two hours and ten minutes at 1650° C. at the vacuum degree of $2\times10^{-2}$ Pa or lower to generate bubbles. Thereafter, each bubble density exposed on surfaces of the respective samples was visually confirmed.

Results of Experimental Examples 3-1 to 3-8 are shown in Table 2.

TABLE 2

| | Experimental example No. | Bubble density exposed on inner surface after VBT [pcs/cm$^2$] |
|---|---|---|
| Part with blue fluorescence emitted | Experimental example 3-1 | 0.06 |
| | Experimental example 3-2 | 0.16 |
| | Experimental example 3-3 | 0.22 |
| | Experimental example 3-4 | 0.00 |
| Part with no blue fluorescence emitted | Experimental example 3-5 | 0.59 |
| | Experimental example 3-6 | 0.38 |
| | Experimental example 3-7 | 0.47 |
| | Experimental example 3-8 | 0.91 |

As Table 2 indicates, the bubble density exposed on the inner surface differs depending on a condition of the fluorescence. In other words, the part having the blue fluorescence detected indicates that the bubble density after VBT has been largely suppressed.

Repetitive execution of the melting experiment resulted in the estimation with respect to the importance on direct supply of the scattered hydrogen doped silica powder to the subject part. The following assumption may support the estimation as above. That is, in the synthetic transparent layer formed of the scattered hydrogen doped silica powder flowing downward under the gravity, or flowing circumferentially under the centrifugal force rather than formed of the directly adhered material, the effect derived from hydrogen is eliminated, and as a result, the fluorescence is not emitted by the natural transparent layer below the synthetic transparent layer. Based on the estimation, the hydrogen doped silica powder was supplied in the process of melting the quartz glass crucible while moving a raw material powder supply port for supplying the hydrogen doped silica powder from the bottom portion to the straight body portion. This attained direct adhesion of the hydrogen doped silica powder over the entire inner surface region for supplying hydrogen. The resultant quartz glass crucible had the blue fluorescence emitted in the natural transparent thin layer over the entire surface of the quartz glass crucible. Upon evaluation of the synthetic transparent layer of each part of the thus obtained quartz glass crucible, it was found out that the bubble suppression function was excellent. The use of the same quartz glass crucible for pulling the silicon single crystal improved the silicon single crystal pulling record (DF ratio). The repetitive melting experiments succeeded in preparation of the quartz glass crucible by the melting process, having the blue fluorescence generated over the entire surface. The above prepared quartz glass crucible will be described referring to Experimental Examples 4-1 to 4-8.

Experimental Example 4-1

The generally employed quartz glass crucible 10 as illustrated in FIG. 5 was manufactured using the hydrogen doped synthetic quartz powder as the raw material powder for the inner layer 22 by the similar methods to those employed in Experimental Examples 3-1 to 3-8 while changing manufacturing conditions (Experimental Example 4-1).

Preparation of Sample

Samples each size of approximately 4 cm×8 cm were cut out at an interval of 100 mm from the bottom center 11 to the straight body portion 14 of the prepared quartz glass crucible 10. A position at a distance of 0 mm (bottom center) from the bottom center 11 indicates the position which contains the bottom center 11. Each position at a distance of 100 mm, 200 mm, and 300 mm from the bottom center 11 is located on the bottom portion 12 (that is, the large-R portion). A position at a distance of 400 mm from the bottom center 11 is located on the curved portion 13 (that is, the small-R portion). Each position at a distance of 500 mm, 600 mm, and 700 mm from the bottom center 11 is located on the straight body portion 14. The position at the distance of 500 mm from the bottom center 11 is located around the lower section of the straight body portion 14.

Measurement of Blue Fluorescence

Each sample was irradiated with ultraviolet rays having a peak at approximately 254 nm wavelength to visually confirm existence or non-existence of generation of the blue fluorescence having a peak at approximately 395 nm wavelength.

Measurement of Bubble Density

After the measurement of the blue fluorescence, each sample of the quartz glass crucible 10 prepared in Experimental Example 4-1 was subjected to the measurement of bubble density after VBT based on the evaluation method disclosed in Patent Document 8. Each sample was held for two hours and ten minutes at 1650° C. at the vacuum degree of $2\times10^{-2}$ Pa or lower to generate bubbles. Thereafter, each density of the bubbles exposed on surfaces of the respective samples was visually confirmed.

Experimental Examples 4-2 to 4-8

The generally employed quartz glass crucible 10 as illustrated in FIG. 5 was manufactured using the hydrogen doped synthetic quartz powder as the raw material powder for the inner layer 22 by the similar methods to those employed in Experimental Examples 3-1 to 3-8, and 4-1 while slightly changing the manufacturing condition (Experimental Examples 4-2 to 4-8).

The quartz glass crucible 10 prepared in Experimental Examples 4-2 to 4-8 was subjected to a series of processes for preparing samples, measuring the blue fluorescence, and measuring the bubble density similarly to Experimental Example 4-1.

In Experimental Examples 4-2, 4-3, like Experimental Example 4-1, the blue fluorescence was observed in all the samples, and the fluorescence was detected over the entire surface. In the bubble generation testing after VBT, generation of bubbles was suppressed in all the samples.

In Experimental Examples 4-4 to 4-8, the blue fluorescence was detected only in a part of the samples, and the blue fluorescence was not detected in a part of the samples.

Results of Experimental Examples 4-1 to 4-8 are shown in Table 3.

TABLE 3

| | Existence/ Non-Existence of blue fluorescence | Bubble density exposed on inner surface after VBT over entire surface of sample [sample/4 cm × 8 cm] | | | | | | | |
|---|---|---|---|---|---|---|---|---|---|
| | | 0 mm from bottom | 100 mm from bottom | 200 mm from bottom | 300 mm from bottom | 400 mm from bottom | 500 mm from bottom | 600 mm from bottom | 700 mm from bottom |
| Experimental example 4-1 | Existence over entire surface | 0 | 0 | 2 | 6 | 0 | 4 | 0 | 5 |
| Experimental example 4-2 | Existence over entire surface | 2 | 3 | 2 | 7 | 0 | 1 | 1 | 1 |
| Experimental example 4-3 | Existence over entire surface | 3 | 3 | 1 | 7 | 2 | 2 | 1 | 8 |
| Experimental example 4-4 | Partially non-existence | 2 | 1 | 2 | 19 | 5 | 0 | 19 | 12 |
| Experimental example 4-5 | Partially non-existence | 5 | 3 | 4 | 34 | 3 | 0 | 0 | 4 |
| Experimental example 4-6 | Partially non-existence | 7 | 7 | 4 | 15 | 0 | 1 | 28 | 29 |
| Experimental example 4-7 | Partially non-existence | 2 | 4 | 3 | 26 | 0 | 15 | 24 | 36 |
| Experimental example 4-8 | Partially non-existence | 1 | 2 | 10 | 36 | 19 | 23 | 32 | 24 |

Table 4 shows data converted into values of the density of bubbles exposed to the inner surface after VBT per unit area (1 $cm^2$).

TABLE 4

| | Existence/ Non-Existence of blue fluorescence | Bubble density exposed on inner surface after VBT [$pcs/cm^2$] | | | | | | | |
|---|---|---|---|---|---|---|---|---|---|
| | | 0 mm from bottom | 100 mm from bottom | 200 mm from bottom | 300 mm from bottom | 400 mm from bottom | 500 mm from bottom | 600 mm from bottom | 700 mm from bottom |
| Experimental example 4-1 | Existence over entire surface | 0.00 | 0.00 | 0.06 | 0.19 | 0.00 | 0.13 | 0.00 | 0.16 |
| Experimental example 4-2 | Existence over entire surface | 0.06 | 0.09 | 0.06 | 0.22 | 0.00 | 0.03 | 0.03 | 0.03 |
| Experimental example 4-3 | Existence over entire surface | 0.09 | 0.09 | 0.03 | 0.22 | 0.06 | 0.06 | 0.03 | 0.25 |
| Experimental example 4-4 | Partially non-existence | 0.06 | 0.03 | 0.06 | 0.59 | 0.16 | 0.00 | 0.59 | 0.38 |
| Experimental example 4-5 | Partially non-existence | 0.16 | 0.09 | 0.13 | 1.06 | 0.09 | 0.00 | 0.00 | 0.13 |
| Experimental example4-6 | Partially non-existence | 0.22 | 0.22 | 0.13 | 0.47 | 0.00 | 0.03 | 0.88 | 0.91 |
| Experimental example 4-7 | Partially non-existence | 0.06 | 0.13 | 0.09 | 0.81 | 0.00 | 0.47 | 0.75 | 1.13 |
| Experimental example 4-8 | Partially non-existence | 0.03 | 0.06 | 0.31 | 1.13 | 0.59 | 0.72 | 1.00 | 0.75 |

As Tables 3 and 4 indicate, the blue fluorescence may be made detectable over the entire surface of the quartz glass crucible 10 in accordance with the manufacturing condition. The manufacturing condition may be easily set through verification of the blue fluorescence detection by performing the melting experiment repeatedly. Examples of the manufacturing condition include change in the gas circulation position in the melting atmosphere, and change in the position to which the raw material quartz powder is supplied.

EXAMPLE

Examples and comparative examples according to the present invention are described below further specifically. The present invention, however, is not limited to those examples.

Examples of the first embodiment according to the present invention will be described.

Example 1-1

The generally employed quartz glass crucible 10 as illustrated in FIG. 5 was manufactured using the hydrogen doped synthetic quartz powder as the raw material powder for the inner layer 22 (Example 1-1).

The quartz glass crucible 10 manufactured in Example 1-1 was irradiated with ultraviolet rays at 254 nm wavelength as the excitation light from the inner surface side. As FIG. 4 indicates, the distribution of generated blue fluorescence was observed. Referring to FIG. 4, the blue fluorescence was observed on the curved portion 13 (small-R portion) in FIG. 4, but hardly observed, or appeared weak on the bottom portion 12 from the bottom center 11, and the straight body portion 14. It became clear that the curved portion 13 of the manufactured quartz glass crucible 10 was sufficiently doped with hydrogen, exhibiting the bubble suppressing effect. Other portions, however, were not sufficiently doped with hydrogen.

Examples 2-1 to 2-8

The generally employed quartz glass crucible 10 as illustrated in FIG. 5 was manufactured using the hydrogen doped synthetic quartz powder as the raw material powder for the inner layer 22 by the similar method to the one employed in Example 1-1 while slightly changing the manufacturing condition (Examples 2-1 to 2-8).

Preparation of Standard Sample

Quartz glass crucibles were manufactured under various manufacturing conditions, from which measurement samples were cut out. A standard sample satisfying the condition expressed as the formula (1) of $20\ (A/B)\times 1000<25$ (where A/B denotes the fluorescence intensity) was selected from those measurement samples.

The quartz glass crucibles 10 manufactured in Examples 2-1 to 2-8 were irradiated with ultraviolet rays with 254 nm wavelength as the excitation light nondestructively from the inner surface side. In this case, each of the straight body portions 14 of the quartz glass crucibles 10 in the respective examples was visually observed with respect to generation of the blue fluorescence. As Table 5 indicates, in the case of the samples in Examples 2-1 to 2-4, the blue fluorescence having equivalent or higher intensity compared with the standard sample was observed. On the contrary, in the case of the samples in the examples 2-5 to 2-8, the blue fluorescence having lower intensity compared with the standard sample was observed. This indicates that the samples in the examples 2-1 to 2-4 satisfy the condition as the formula (1) of $20\ (A/B)\times 1000$ (where A/B denotes the fluorescence intensity) (that is, a large volume of hydrogen doping and a large volume of oxygen deficiency defects). The results of the examples 2-5 to 2-8 indicate that the fluorescence intensity $(A/B)\times 1000$ is lower than 20 (that is, a small volume of hydrogen doping and a small volume of oxygen deficiency defects).

TABLE 5

| | Fluorescence intensity compared with standard sample | Bubble density exposed on inner surface after VBT [pcs/cm$^2$] |
|---|---|---|
| Example 2-1 | Equivalent or higher | 0.06 |
| Example 2-2 | Equivalent or higher | 0.16 |
| Example 2-3 | Equivalent or higher | 0.22 |
| Example 2-4 | Equivalent or higher | 0.00 |
| Example 2-5 | Low | 0.59 |
| Example 2-6 | Low | 0.38 |
| Example 2-7 | Low | 0.47 |
| Example 2-8 | Low | 0.91 |

The progress of bubbles generated in each of the quartz glass crucibles 10 manufactured in Examples 2-1 to 2-8 was investigated for confirming the results. Measurement samples were cut out from the quartz glass crucibles 10 in Examples 2-1 to 2-8, respectively, and subjected to the measurement of bubble density after VBT. Each of the samples was held for two hours and ten minutes at 1650° C. at the vacuum degree of $2\times 10^{-2}$ Pa or lower to generate bubbles. Thereafter, each bubble density exposed on surfaces of the respective samples was visually confirmed. Table 5 shows the obtained results.

As Table 5 indicates, the volume of oxygen deficiency defects of the nondestructively evaluated quartz glass crucibles 10 in Examples 2-1 to 2-8 reflects the bubble density after VBT. That is, the high fluorescence intensity (Examples 2-1 to 2-4) results in the low exposed bubble density. The low fluorescence intensity (Examples 2-5 to 2-8) results in the high exposed bubble density.

An example and a comparative example of the second embodiment according to the present invention are described.

COMPARATIVE EXAMPLE

In the phase at which the relation between the blue fluorescence and the transparent layer was not found, the research was conducted on the yield of the quartz glass crucibles each having the blue fluorescence generated over the entire area for covering the bottom portion, the curved portion, and the straight body portion. The research resulted in the manufacturing rate of such quartz glass crucible as above accounting for 0%.

Example 3

With the scattering method, the hydrogen doped silica powder was supplied at a rate of 200 g/min or higher from the bottom portion to the straight body portion of the quartz glass crucible using a raw material powder supply pipe formed of synthetic quartz, having an inner diameter of 16 mm or smaller while regulating an airflow generated by an arc discharge. The supplied raw material powder was melted so that the thickness of the synthetic transparent layer over the entire inner surface area of the quartz glass crucible became 1 mm or larger. The emission state of the blue fluorescence in the quartz glass crucible was confirmed. Then the position of the raw material power supply pipe was adjusted to allow adhesion of the hydrogen doped silica powder to the part with no or weak emission, and the melting process was executed. The melting experiment and regulation of conditions were repeatedly performed until the blue fluorescence was observed over the entire surface of the quartz glass crucible. The conditions for manufacturing the quartz glass crucible with the blue fluorescence over the entire surface were set. As a result of manufacturing the quartz glass crucibles under the set manufacturing conditions, the manufacturing rate of the quartz glass crucibles having the blue fluorescence emitted over the entire surface was raised to 93.8% (61/65 pieces), resulting in the stable supply. Table 6 shows results derived from Example 3 and Comparative Example.

TABLE 6

| | Rate of quartz glass crucibles with blue fluorescence emitted over entire surface [ %] |
|---|---|
| Comparative Example: when relation between blue fluorescence and transparent layer is unknown | 0.0 |
| Example 3: after repetitive performance of experiment | 93.8 |

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A quartz glass crucible constituted by a bottom portion, a curved portion and a straight body portion, wherein the quartz glass crucible comprises an outer layer formed of an opaque quartz glass containing uniformly distributed bubbles, an inner layer formed of a transparent quartz glass, and a boundary region between the outer layer and the inner layer, wherein, when the quartz glass crucible is irradiated with ultraviolet rays as an excitation light, a blue fluorescence is generated in the boundary region, wherein the blue fluorescence indicates oxygen deficiency defects in the outer layer of the quartz glass crucible, and wherein the blue fluorescence is generated entirely and uniformly over the bottom portion, the curved portion, and the straight body portion of the quartz glass crucible.

2. The quartz glass crucible according to claim 1, wherein the outer layer contains a natural quartz glass, the inner layer contains a synthetic quartz glass, and the blue fluorescence is generated in a region where the natural quartz glass comes into contact with the synthetic quartz glass.

3. The quartz glass crucible according to claim 1, wherein the inner layer contains a quartz glass doped with hydrogen, or a quartz glass introduced with water vapor.

4. The quartz glass crucible according to claim 2, wherein the inner layer contains a quartz glass doped with hydrogen, or a quartz glass introduced with water vapor.

5. The quartz glass crucible according to claim 1, wherein the blue fluorescence has a peak at approximately 395 nm wavelength.

6. The quartz glass crucible according to claim 2, wherein the blue fluorescence has a peak at approximately 395 nm wavelength.

7. The quartz glass crucible according to claim 3, wherein the blue fluorescence has a peak at approximately 395 nm wavelength.

8. The quartz glass crucible according to claim 4, wherein the blue fluorescence has a peak at approximately 395 nm wavelength.

9. The quartz glass crucible according to claim 1, wherein the ultraviolet rays for irradiation have a peak at approximately 254 nm wavelength.

10. The quartz glass crucible according to claim 2, wherein the ultraviolet rays for irradiation have a peak at approximately 254 nm wavelength.

11. The quartz glass crucible according to claim 3, wherein the ultraviolet rays for irradiation have a peak at approximately 254 nm wavelength.

12. The quartz glass crucible according to claim 4, wherein the ultraviolet rays for irradiation have a peak at approximately 254 nm wavelength.

13. The quartz glass crucible according to claim 5, wherein the ultraviolet rays for irradiation have a peak at approximately 254 nm wavelength.

14. The quartz glass crucible according to claim 6, wherein the ultraviolet rays for irradiation have a peak at approximately 254 nm wavelength.

15. The quartz glass crucible according to claim 7, wherein the ultraviolet rays for irradiation have a peak at approximately 254 nm wavelength.

16. The quartz glass crucible according to claim 8, wherein the ultraviolet rays for irradiation have a peak at approximately 254 nm wavelength.

* * * * *